United States Patent
Xu

(10) Patent No.: US 10,955,372 B2
(45) Date of Patent: Mar. 23, 2021

(54) INTEGRATED ENVIRONMENTAL SENSOR FOR DAMAGE SENSING

(71) Applicant: Nokia Technologies Oy, Espoo (FI)

(72) Inventor: Chen Xu, Warren, NJ (US)

(73) Assignee: Nokia Technologies Oy, Espoo (FI)

( * ) Notice: Subject to any disclaimer, the term of this patent is extended or adjusted under 35 U.S.C. 154(b) by 162 days.

(21) Appl. No.: 16/380,474

(22) Filed: Apr. 10, 2019

(65) Prior Publication Data
US 2020/0326292 A1 Oct. 15, 2020

(51) Int. Cl.
*G01N 27/04* (2006.01)
(52) U.S. Cl.
CPC .................................. *G01N 27/045* (2013.01)
(58) Field of Classification Search
CPC ...................................................... G01N 27/045
See application file for complete search history.

(56) References Cited

U.S. PATENT DOCUMENTS

| 5,332,961 | A  | 7/1994  | Hammerle |
| 10,067,179 | B2 | 9/2018  | Xu |
| 2005/0269213 | A1 | 12/2005 | Steimle et al. |
| 2008/0204275 | A1 | 8/2008  | Wavering et al. |

(Continued)

FOREIGN PATENT DOCUMENTS

| CN | 101038263 A | 9/2007 |
| CN | 101666737 B | 6/2012 |

(Continued)

OTHER PUBLICATIONS

"Climatic Reliability of Electronics: Early Prediction and Control of Contamination and humidity effects", orbit.dtu.dk, 2015 [retrieved on Jan. 29, 2019] Retrieved from the Internet: <URL: http://orbit.dtu.dk/files/134633664/Vadimas_Verdingovas_PhD_Thesis.pdf> (205 pages).

(Continued)

*Primary Examiner* — Clayton E. LaBalle
*Assistant Examiner* — Michael A Harrison
(74) *Attorney, Agent, or Firm* — Mendelsohn Dunleavy, P.C.; Yuri Gruzdkov

(57) ABSTRACT

An equipment-monitoring system having a resistive sensor designed for two- or four-terminal sensing of damage thereto caused by an environmental exposure. In an example embodiment, the resistive sensor comprises a sense resistor susceptible to the environmental exposure and a reference resistor protected from the environmental exposure, the sense and reference resistors being internally connected to four terminals of the sensor in a manner that enables external bridge-type measurements of the electrical resistance of the sense resistor. In some embodiments, the sense resistor comprises a relatively large number of flat metal stripes connected in parallel to one another between two of the four terminals, which advantageously provides an extended dynamic range of the damage detectable with the corresponding sensor and improves the sensor reliability. In various embodiments, the disclosed resistive sensors can be used to monitor damage to electrical circuits and/or critical structural elements of the corresponding equipment.

16 Claims, 8 Drawing Sheets

(56) References Cited

U.S. PATENT DOCUMENTS

| | | | |
|---|---|---|---|
| 2012/0188078 A1* | 7/2012 | Soles | G01N 29/04 |
| | | | 340/540 |
| 2017/0350936 A1 | 12/2017 | McMeen et al. | |
| 2018/0059173 A1* | 3/2018 | Xu | G01R 31/2812 |
| 2018/0284011 A1 | 10/2018 | Farkas et al. | |
| 2019/0004109 A1 | 1/2019 | Xu | |

FOREIGN PATENT DOCUMENTS

| | | |
|---|---|---|
| CN | 102937611 A | 2/2013 |
| CN | 108956703 A | 12/2018 |
| JP | 2018163144 A | 10/2018 |

OTHER PUBLICATIONS

"PC-Board_Mountable Corrosion Sensors", www.techbriefs.com, 2017 [retrieved on Feb. 1, 2019], Retrieved from the Internet: <URL: https://www.techbriefs.com/component/content/article/tb/techbriefs/sensors-data-acquisition/27664> (3 pages).

U.S. Appl. No. 16/164,079, filed Oct. 18, 2018; first named inventor: Xu, Chen.

Extended European Search Report for corresponding European application No. 20167233.4; dated Aug. 18, 2020 (10 pages).

* cited by examiner

500

700

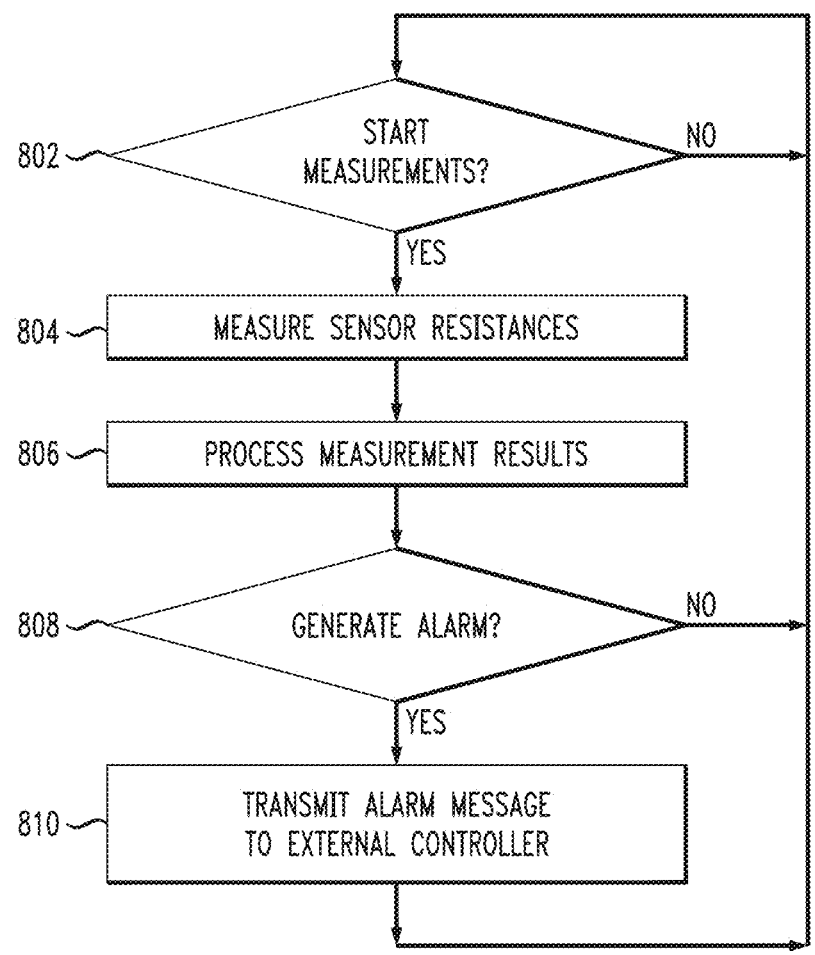

INTEGRATED ENVIRONMENTAL SENSOR FOR DAMAGE SENSING

BACKGROUND

Field

Various example embodiments relate to equipment having sensors for estimating environmentally caused damage thereto.

Description of the Related Art

This section introduces aspects that may help facilitate a better understanding of the disclosure. Accordingly, the statements of this section are to be read in this light and are not to be understood as admissions about what is in the prior art or what is not in the prior art.

Environmental conditions can have a drastic effect on the reliability and performance of electrical circuits, such as those used in the telecom equipment deployed in geographic regions characterized by harsh environments. For example, the adverse effects of exposure to extreme temperatures, high humidity, atmospheric dust, and corrosive agents can cause some electrical circuits to fail. It is therefore desirable to have a system in place that can estimate the working condition of environmentally exposed circuits and warn the equipment operator when a remedial action appears to be justified.

SUMMARY OF SOME SPECIFIC EMBODIMENTS

Disclosed herein are various embodiments of an equipment-monitoring system having a resistive sensor designed for two-terminal (2T) or four-terminal (4T) sensing of damage thereto caused by an environmental exposure. In an example embodiment, the resistive sensor comprises a sense resistor that is susceptible to the environmental exposure and a reference resistor that is protected from the environmental exposure, the sense and reference resistors being internally connected to four terminals of the sensor in a manner that enables external bridge-type measurements of the electrical resistance of the sense resistor. In some embodiments, the sense resistor comprises a relatively large number (e.g., >5) of flat metal stripes connected in parallel to one another between two of the four terminals, which advantageously provides an extended dynamic range of the damage detectable with the corresponding sensor and improves the sensor reliability. In some embodiments, one or more alarm thresholds can be adaptively adjusted to account for the effects of hidden manufacturing defects in some resistive sensors. In various embodiments, the disclosed resistive sensors can be used to monitor damage to electrical circuits and/or critical structural elements of the corresponding equipment.

According to an example embodiment, provided is an apparatus comprising: a control circuit; and an integrated planar resistive sensor having a first parallel array of electrically conductive traces electrically connected across electrical terminals of the control circuit, the first parallel array being constructed to expose at least some of the electrically conductive traces thereof to an environmental atmosphere; and wherein the control circuit is configured to generate an alarm in response to measuring a resistance of the integrated planar resistive sensor that is higher than a threshold, the threshold being such that the alarm is not automatically generated in response to one of the electrically conductive traces being broken.

According to another example embodiment, provided is an apparatus comprising: a plurality of resistive sensors electrically connected to a control circuit, the resistive sensors being constructed such that electrical resistances thereof are responsive to damage caused by an environmental exposure of the resistive sensors, the control circuit being configured to measure the electrical resistances; wherein the plurality of resistive sensors includes a first resistive sensor having a plurality of electrically conductive traces disposed on a substrate and electrically connected to four electrical terminals, each of the electrical terminals being externally electrically connected to the control circuit, some of the electrically conductive traces being protected from the environmental exposure to form a reference resistor within the first resistive sensor, some other of the electrically conductive traces being susceptible to the environmental exposure to form a sense resistor within the first resistive sensor; and wherein the control circuit is configured to measure an electrical resistance of the sense resistor by probing the sense and reference resistors through the four electrical terminals.

BRIEF DESCRIPTION OF THE DRAWINGS

Other aspects, features, and benefits of various disclosed embodiments will become more fully apparent, by way of example, from the following detailed description and the accompanying drawings, in which:

FIG. 8 shows a flowchart of a method of estimating the condition of the equipment of FIG. 6 according to an embodiment.

DETAILED DESCRIPTION

Some embodiments may benefit from the use of some features disclosed in U.S. Pat. No. 10,067,179 and U.S. patent application Ser. Nos. 16/101,916 and 16/164,079, each of which is incorporated herein by reference in its entirety.

Figure 1:
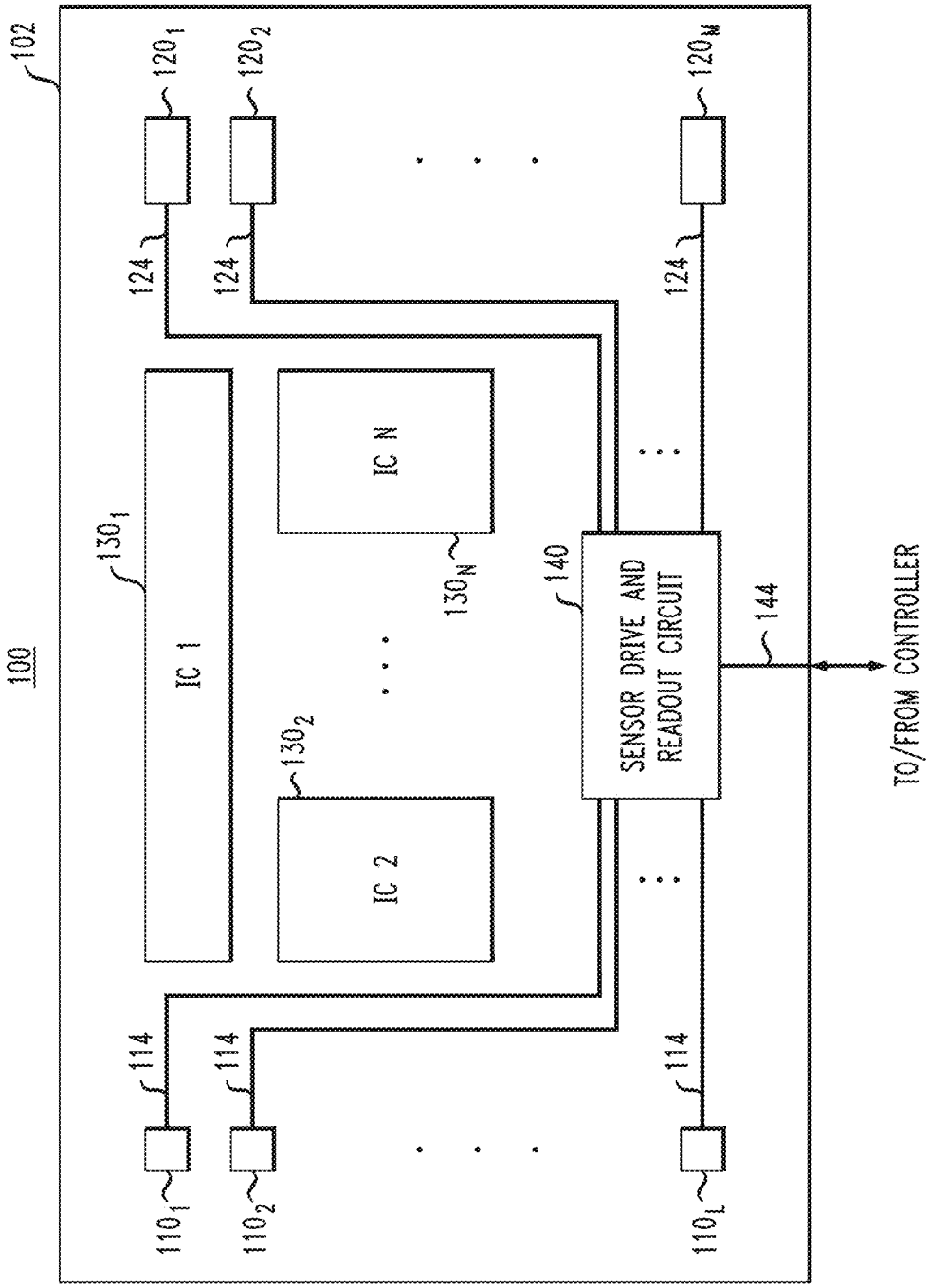
FIG. 1 shows a block diagram of an electrical circuit according to an embodiment.

FIG. 1 shows a block diagram of an electrical circuit 100 according to an embodiment. Circuit 100 includes a printed circuit board (PCB) 102 that mechanically supports and electrically connects various electronic components of the circuit using conductive tracks, pads, and other features etched from the sheet(s) of an electrically conductive material laminated onto a non-conductive (e.g., dielectric) substrate. For illustration purposes and without any implied limitation, only some of the conductive tracks, e.g., labeled 114 and 124, of PCB 102 are shown in FIG. 1. In various embodiments, PCB 102 can be single sided (e.g., having conductive tracks arranged in a single surface layer), double sided (e.g., having conductive tracks arranged in two surface layers), or multi-layered (e.g., having a multi-layer stack of conductive tracks electrically interconnected using conductive vias).

In an example embodiment, the electronic components of circuit 100 may include an assortment of one or more integrated-circuit (IC) packages and/or one or more discrete circuit elements (such as capacitors, resistors, inductors, and/or active devices) that are typically soldered onto PCB 102. In some embodiments, some of the electronic components of circuit 100 may be embedded into the substrate of PCB 102. For illustration purposes and without any implied limitation, circuit 100 is depicted in FIG. 1 as having the following circuit components: (i) a plurality of sensors $110_1$-$110_L$, (ii) a plurality of sensors $120_1$-$120_M$, (iii) one or more IC packages $130_1$-$130_N$, and (iv) a sensor drive-and-readout circuit 140, where each of L and M is an integer greater than one, and N is a positive integer. Embodiments in which L=2, or M=2, or L=M=2 are also possible. In some embodiments, IC packages $130_1$-$130_N$ are optional and may be absent. Embodiments in which N=1 or 2 are also possible.

Sensors $110_1$-$110_L$ are electrically connected to the sensor drive-and-readout circuit 140 by way of conductive tracks 114. Sensors $120_1$-$120_M$ are similarly electrically connected to the sensor drive-and-readout circuit 140 by way of conductive tracks 124. Circuit 140 can be electrically connected to an external electronic controller by way of conductive tracks 144. In operation, circuit 140 can perform one or more of the following functions: (i) respond to control signals received by way of conductive tracks 144 from an external electronic controller to perform resistance measurements of individual sensors $110_1$-$110_L$ and $120_1$-$120_M$; (ii) generate and apply various voltages and/or currents to individual sensors $110_1$-$110_L$ and $120_1$-$120_M$; (iii) sense and measure various voltages and/or currents at sensors $110_1$-$110_L$ and $120_1$-$120_M$; (iv) perform signal processing to determine resistance values corresponding to individual sensors $110_1$-$110_L$ and $120_1$-$120_M$; and (v) generate control signals for the external electronic controller that indicate the estimated working condition of IC packages $130_1$-$130_N$ and/or other electronic circuits, devices, and structural elements located in relatively close proximity to one or more sensors 110 and 120. In various embodiments, circuit 140 can be implemented as an application-specific integrated circuit (ASIC) or a microcontroller.

Figure 6:
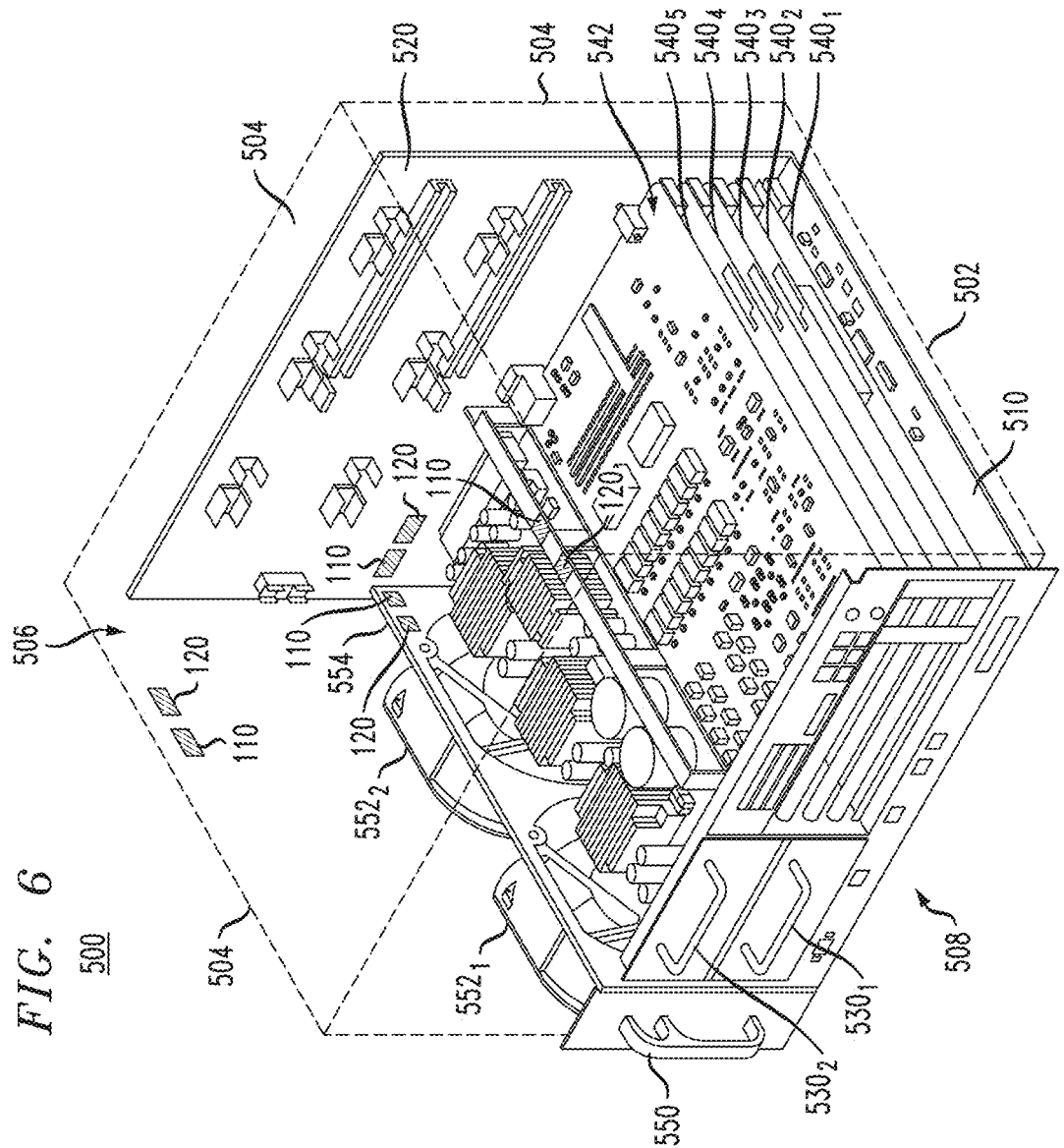
FIG. 6 shows a semi-transparent perspective view of an air-cooled equipment cabinet according to an embodiment.

In some embodiments, circuit 140 can be electrically connected to one or more additional sensors 110 and/or 120 located outside PCB 102, e.g., as indicated in FIG. 6. Such additional sensors can be used, e.g., to estimate the condition of some structural or functional elements of the corresponding assembly, rack, enclosure, box, or cabinet.

In an example embodiment, circuit 100 can be housed in an air-cooled equipment enclosure, such as a cabinet, rack, box, or the like (not explicitly shown in FIG. 1; see FIG. 6), that contains telecommunication or other sensitive equipment. In some embodiments, IC packages $130_1$-$130_N$ may comprise electronic and/or optical circuits and devices that are part of the equipment. Sensors $110_1$-$110_L$ and $120_1$-$120_M$ and the sensor drive-and-readout circuit 140 can be used to estimate the adverse effects of environmental exposure on and the working condition of the equipment housed in the same equipment enclosure as circuit 100, e.g., as further described below in reference to FIGS. 2-8. In embodiments in which IC packages $130_1$-$130_N$ are absent, circuit 100 is a dedicated circuit that can be used primarily or exclusively for such estimation purposes. The information obtained using sensors $110_1$-$110_L$, $120_1$-$120_M$, and optionally the above mentioned additional sensors 110 and/or 120 can beneficially be used, e.g., to forecast the demand for spare parts, minimize or avoid the costly network outage caused by impending equipment failure, and/or flag an offending site in order to limit further equipment deployment therein, implement a site improvement, or initiate equipment relocation therefrom.

Figure 2:
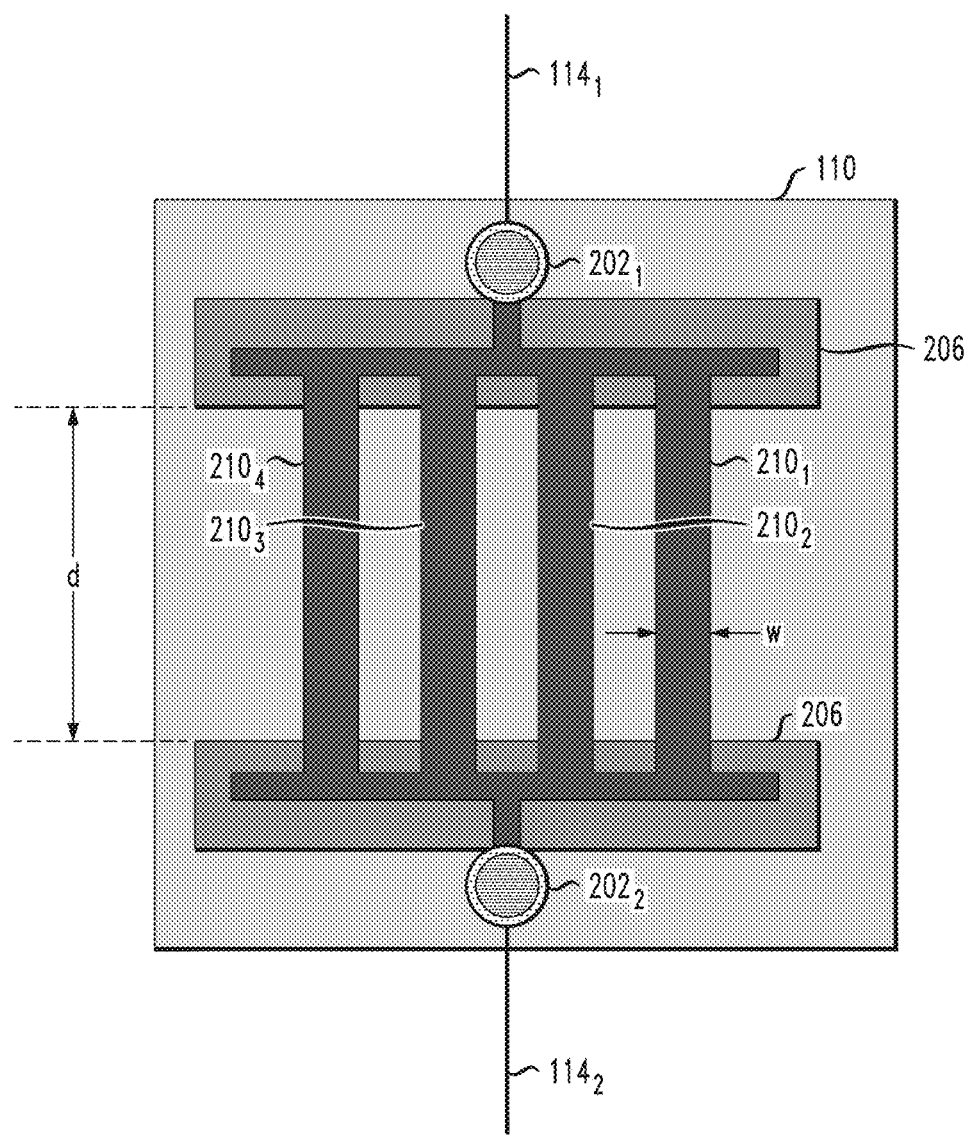
FIG. 2 shows a schematic view of a first sensor that can be used in the electrical circuit of FIG. 1 according to an embodiment.

FIG. 2 shows a schematic view of an individual sensor 110 that can be used in circuit 100 (FIG. 1) according to an embodiment. Sensor 110 can be electrically connected to the sensor drive-and-readout circuit 140 using conductive tracks $114_1$ and $114_2$ connected to contact pads $202_1$ and $202_2$, respectively, of the sensor as indicated in FIG. 2. As already indicated above, conductive tracks $114_1$ and $114_2$ can be used to perform one or more of the following: (i) apply a desired voltage to sensor 110; (ii) sense a voltage across sensor 110; (iii) drive a desired current through sensor 110; and (iv) sense a current flowing through sensor 110.

In an example embodiment, sensor 110 comprises a plurality of electrically conductive traces 210 that are connected in parallel to one another between contact pads $202_1$ and $202_2$, e.g., as indicated in FIG. 2. For illustration purposes and without any implied limitation, sensor 110 is depicted in FIG. 2 as having four such electrically conductive traces, which are labeled $210_1$-$210_4$. In an alternative embodiment, sensor 110 may have a different (from four) number of conductive traces 210.

Each of conductive traces $210_1$-$210_4$ comprises a substantially flat metal stripe that has a constant width w and a constant thickness t. For illustration, the width w is indicated in FIG. 2 for conductive trace $210_1$. The thickness t represents the dimension of conductive trace 210 in the direction that is orthogonal to the plane of FIG. 2. The ends of conductive traces $210_1$-$210_4$ are encapsulated using stripes 206 of a suitable protective (e.g., polymeric or ceramic) material. This protective material serves to ensure good electrical contact between conductive traces $210_1$-$210_4$ and contact pads $202_1$ and $202_2$ in field conditions where the exposed middle portions of the conductive traces might be subjected to an aggressive or harsh environment. The length of the exposed middle portions of conductive traces $210_1$-$210_4$ is labeled in FIG. 2 as d.

In an example embodiment, the width w, the length d, and the thickness t of conductive traces $210_1$-$210_4$ are selected such that the initial resistance of sensor 110 is in the range between approximately $0.1\Omega$ and approximately $10\Omega$. Environmental exposure and damage typically cause the resistance of sensor 110 to increase over time, e.g., due to corrosion and/or erosion of conductive traces $210_1$-$210_4$. A person of ordinary skill in the art will understand that, for the indicated resistance range, good electrical contacts between conductive traces $210_1$-$210_4$ and contact pads $202_1$ and $202_2$ protected by the encapsulating stripes 206 help to achieve sufficient accuracy/precision of the corresponding resistance measurements.

Different instances of sensor 110 used in circuit 100 (FIG. 1) may differ from one another in one or more of the following characteristics: (i) the material of conductive traces 210; (ii) the width w of conductive traces 210; (iii) the thickness t of conductive traces 210; and (iv) the length d of exposed portions of conductive traces 210. Example materials that can be used to make conductive traces 210 include but are not limited to copper, silver, aluminum, tin, lead, nickel, zinc, iron, and various alloys and/or multi-layered metal structures thereof. The materials for conductive traces 210 are typically selected from the material set used in PCB 102, IC packages $130_1$-$130_N$, and other electronic circuits, devices, and elements expected to be located in close proximity to the sensor(s) 110.

In an example embodiment, sensors $110_1$-$110_L$ may include at least one sensor 110 whose conductive traces 210 are made of copper and at least one sensor 110 whose conductive traces 210 are made of silver. In another example embodiment, the plurality of sensors 110 connected to circuit 140 (FIG. 1) may include two or more sensors 110 whose conductive traces 210 are made of different respective electrically conductive materials (e.g., above-indicated metals or alloys thereof) or different respective sets of electrically conductive materials.

Figure 3:
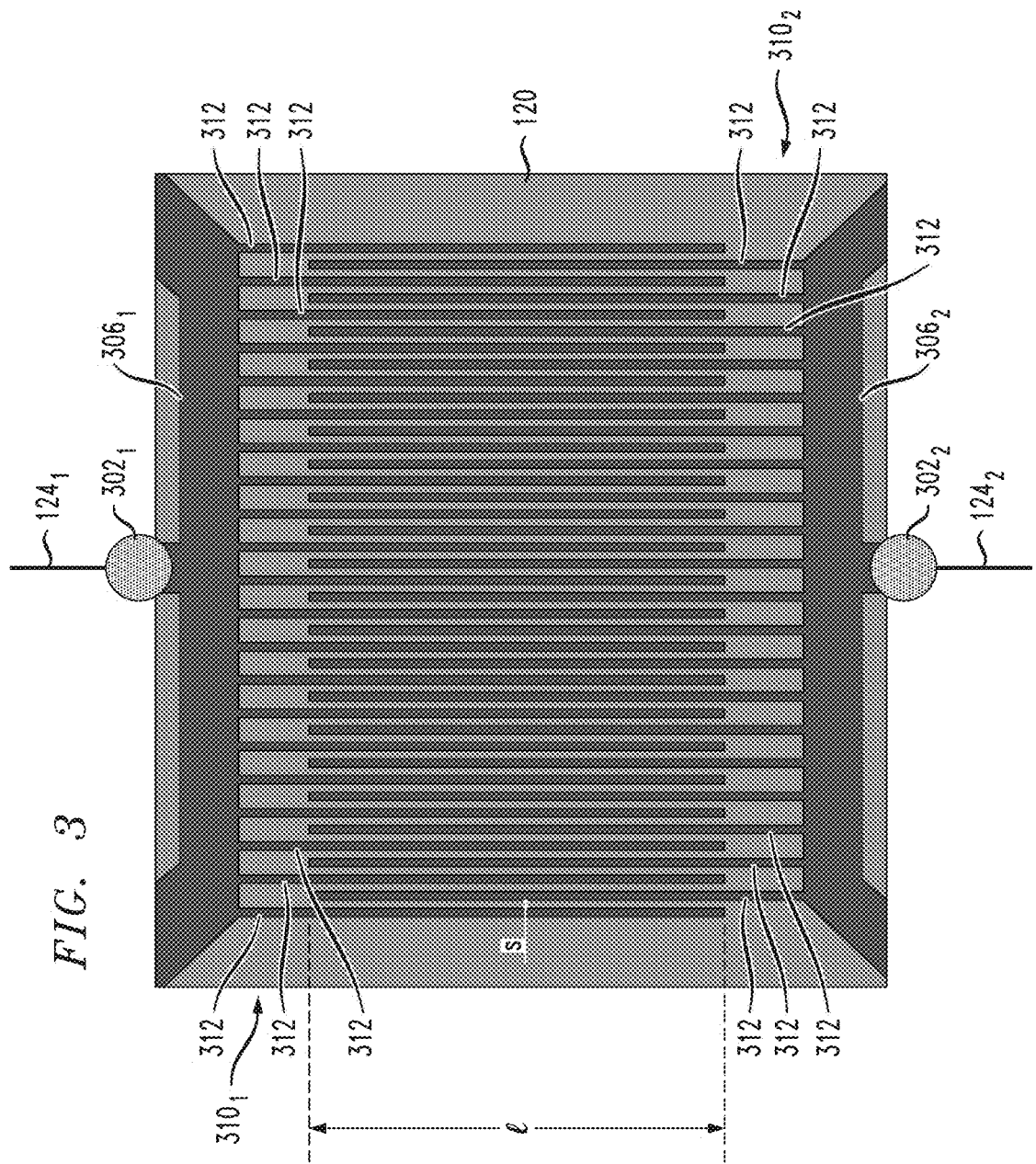
FIG. 3 shows a schematic view of a second sensor that can be used in the electrical circuit of FIG. 1 according to an embodiment.

FIG. 3 shows a schematic view of an individual sensor 120 that can be used in circuit 100 (FIG. 1) according to an embodiment. Sensor 120 can be electrically connected to the sensor drive-and-readout circuit 140 using conductive tracks $124_1$ and $124_2$ connected to contact pads $302_1$ and $302_2$, respectively, of the sensor as indicated in FIG. 3. Conductive tracks $124_1$ and $124_2$ can be used to perform one or more of the following: (i) apply a desired voltage to sensor 120; (ii) sense a voltage across sensor 120; (iii) drive a desired current through sensor 120; and (iv) sense a current flowing through sensor 120.

In an example embodiment, sensor 120 comprises interleaved combs $310_1$ and $310_2$. A base $306_1$ of comb $310_1$ is electrically connected to contact pad $302_1$ as indicated in FIG. 3. A base $306_2$ of comb $310_2$ is similarly electrically connected to contact pad $302_2$. For illustration purposes and without any implied limitation, comb $310_1$ is depicted in FIG. 3 as having 21 teeth 312, and comb $310_2$ is depicted as having 20 teeth 312. In an alternative embodiment, each of combs $310_1$ and $310_2$ may have a different respective number of teeth 312.

In an example embodiment, each of teeth 312 is an electrically conductive (e.g., metal) trace that comprises a substantially flat metal stripe of a constant width and a constant thickness. The spacing s and the overlap length l between teeth 312 belonging to different ones of combs $310_1$ and $310_2$ are selected such that the initial surface insulation resistance (SIR) of sensor 120 is greater than 10 MΩ, but can decrease over time to fall into the range between approximately 10Ω and approximately 10 MΩ due to environmental exposure or damage. For illustration, the spacing s and the overlap length l are indicated in FIG. 3 for a pair of teeth 312 located at the left-hand side of combs $310_1$ and $310_2$. The environmental exposure or damage typically causes the SIR of sensor 120 to decrease, e.g., due to dust and/or salt accumulation, creep corrosion, electrochemical migration, etc.

Different instances of sensor 120 used in circuit 100 (FIG. 1) may differ from one another in one or more of the following: (i) the material of combs $310_1$ and $310_2$; (ii) the spacing s between adjacent teeth 312; (iii) the overlap length l of opposing teeth 312. Example materials that can be used to make combs $310_1$ and $310_2$ include but are not limited to copper, silver, aluminum, nickel, zinc, iron, and various alloys and/or multi-layered metal structures thereof. The materials for combs $310_1$ and $310_2$ are typically selected from the material set used in PCB 102, IC packages $130_1$-$130_N$, and other electronic circuits, devices, and elements expected to be located near the sensor(s) 120.

In an example embodiment, sensors $120_1$-$120_M$ may include at least one sensor 120 whose combs $310_1$ and $310_2$ are made of copper plated with silver and at least one sensor 120 whose combs $310_1$ and $310_2$ are made of copper plated with tin. In another example embodiment, the plurality of sensors 120 connected to circuit 140 (FIG. 1) may include two or more sensors 120 whose combs $310_1$ and $310_2$ are made of different respective electrically conductive materials (e.g., above-indicated metals or alloys thereof) or different respective sets of electrically conductive materials.

Figure 4:
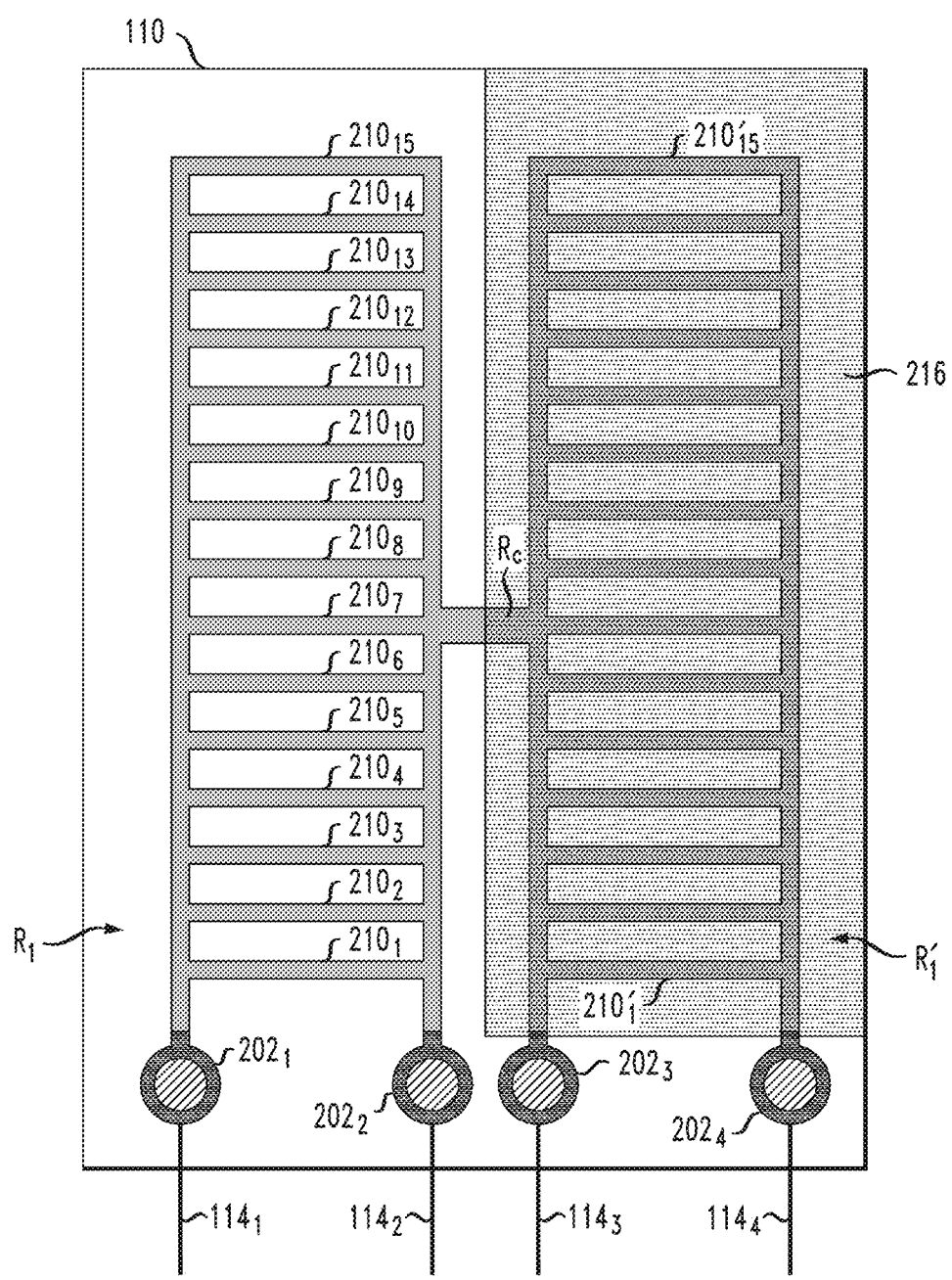
FIG. 4 shows a schematic view of another sensor that can be used in the electrical circuit of FIG. 1 according to an embodiment.

FIG. 4 shows a schematic view of an individual sensor 110 that can be used in circuit 100 (FIG. 1) according to another embodiment. In this embodiment, sensor 110 is implemented as a four-terminal (4T) resistor, with the contact pads $202_1$-$202_4$ of the sensor serving as the four terminals of said resistor. Contact pads $202_1$-$202_4$ can be electrically connected to the sensor drive-and-readout circuit 140 using conductive tracks $114_1$-$114_4$, respectively, as indicated in FIG. 4.

Sensor 110 comprises resistors $R_1$, $R_1'$, and $R_c$ connected to one another as indicated in FIG. 4. For example, resistor $R_c$ electrically connects resistors $R_1$ and $R_1'$ within sensor 110. However, in some embodiments, resistor $R_c$ may be absent, in which case resistors $R_1$ and $R_1'$ are not directly electrically connected within sensor 110.

Resistor $R_1$ comprises a plurality of electrically conductive traces 210 that are connected in parallel to one another between contact pads $202_1$ and $202_2$, e.g., as indicated in FIG. 4. For illustration purposes and without any implied limitation, resistor $R_1$ is depicted in FIG. 4 as having fifteen such electrically conductive traces, which are labeled $210_1$-$210_{15}$. In an alternative embodiment, sensor 110 may have a different (from fifteen) number of conductive traces 210.

In an example embodiment, the geometric sizes (e.g., the width, length, and thickness) of conductive traces $210_1$-$210_{15}$ are selected such that the initial resistance of resistor $R_1$ is in the range between approximately 0.1Ω and approximately 10Ω.

In an example embodiment, resistor $R_1'$ is manufactured to be nominally identical to resistor $R_1$. For example, in the shown embodiment, resistor $R_1'$ comprises fifteen electrically conductive traces $210_1'$-$210_{15}'$ connected in parallel to one another between contact pads $202_3$ and $202_4$ as indicated in FIG. 4. However, unlike resistor $R_1$, which is environmentally exposed, resistor $R_1'$ is protected from the environmental exposure by an encapsulating layer 216. In an example embodiment, layer 216 can be made of any suitable protective (e.g., polymeric or ceramic) material.

In an example embodiment, resistor $R_c$ can be implemented similar to a conductive trace 210, e.g., using a substantially flat metal stripe of constant width and thickness disposed on the same dielectric substrate as resistors $R_1$ and $R_1'$. Layer 216 may cover a portion of resistor $R_c$. As such, resistor $R_c$ may have one portion that is environmentally exposed and another portion that is protected from the environmental exposure.

After deployment in the field, environmental exposure typically causes the resistance of resistor $R_1$ to increase over time, e.g., due to corrosion and/or erosion of conductive traces $210_1$-$210_{15}$. In contrast, the protection provided by encapsulating layer 216 typically causes the resistance of resistor $R_1'$ to remain substantially unchanged during the same period of time. As such, resistor $R_1'$ can be used as a reference resistor, using which resistance changes of resistor $R_1$ can be measured with relatively high accuracy, precision, and sensitivity.

More specifically, sensor 110 of FIG. 4 may be suitable for a four-terminal (4T) sensing method, a 4-wire sensing method, or a 4-point probes method of electrical impedance measurements. Each of these methods typically uses separate pairs of current-carrying and voltage-sensing electrodes to make more accurate measurements than the simpler two-terminal (2T) sensing method. Separation of current and voltage electrodes excludes the lead and contact resistance from the measurement. This is an important feature for precise measurements of low resistance values, e.g., below 100Ω, which is the typical resistance range for sensor 110. For example, resistor $R_c$ can be excluded from the measurement using a suitable variant of the 4T sensing, e.g., as described below in reference to FIG. 7.

Prior to the deployment in the field, some of conductive traces 210 may have internal defects that may not be readily detectable by conventional quality control methods applied to such sensors, e.g., using visual inspection and resistance measurements. The internal defects can, for example, be introduced during metal deposition, trace patterning, etching, planarization, etc. Typical causes of such defects include but are not limited to process imperfections, presence of dust particles, temperature and stress gradients, etc.

Upon the deployment in the field, some internal defects in conductive traces 210 may act as catalysts or accelerators of environmentally induced damage, such as corrosion, etc. For example, a defect may act as a weak spot that enables corrosive processes to initiate at the defect location and then spread out therefrom. In some cases, the resulting damage can produce an electrical break (e.g., a physical gap) in the corresponding conductive trace 210, such that there is no complete path for the electrical current to flow from one end of the trace to the other end of the trace. The broken trace 210 is thus an open circuit that is no longer useful for resistive damage monitoring. In addition, the rate of damage associated with a defect may not give an accurate representation of the rate and/or extent of damage caused by the same environmental exposure in substantially defect-free circuits. For example, many more-complex integrated circuits, such as IC packages 130, may be considered to be substantially defect-free circuits due to the more-rigorous testing that they typically undergo at the factory.

Some of these and other related problems associated with the presence of hidden internal defects can be addressed by embodiments in which sensor 110 has a relatively large number of parallel traces 210. For example, in some embodiments, resistor $R_1$ may have at least five parallel traces 210. In some other embodiments, resistor $R_1$ may have at least ten parallel traces 210. As a result, an undetected internal defect in one of parallel traces 210 will not render the whole sensor 110 useless in a short period of time, because other (e.g., defect-free) traces 210 will still enable resistive damage monitoring as described herein.

For example, one broken trace 210 in the parallel array of ten such traces of sensor 110 will only cause an approximately 10% increase in the resistance of resistor $R_1$. This is well within the capacity of corrective measures (e.g., threshold adjustments) that can be implemented in control circuit 140. Such adjustments enable control circuit 140 not to generate a premature or false alarm (also see the description of the corresponding embodiments of steps 806 and 808 given in reference to FIG. 8). For comparison, a resistive sensor having a single trace 210 connected between two terminals thereof may be rendered useless in a short period of time under the same environmental conditions because the above-described defect (if present) may caused the whole sensor to become a broken (open) circuit in a short period of time corresponding to the defect-accelerated corrosion.

Figure 5:
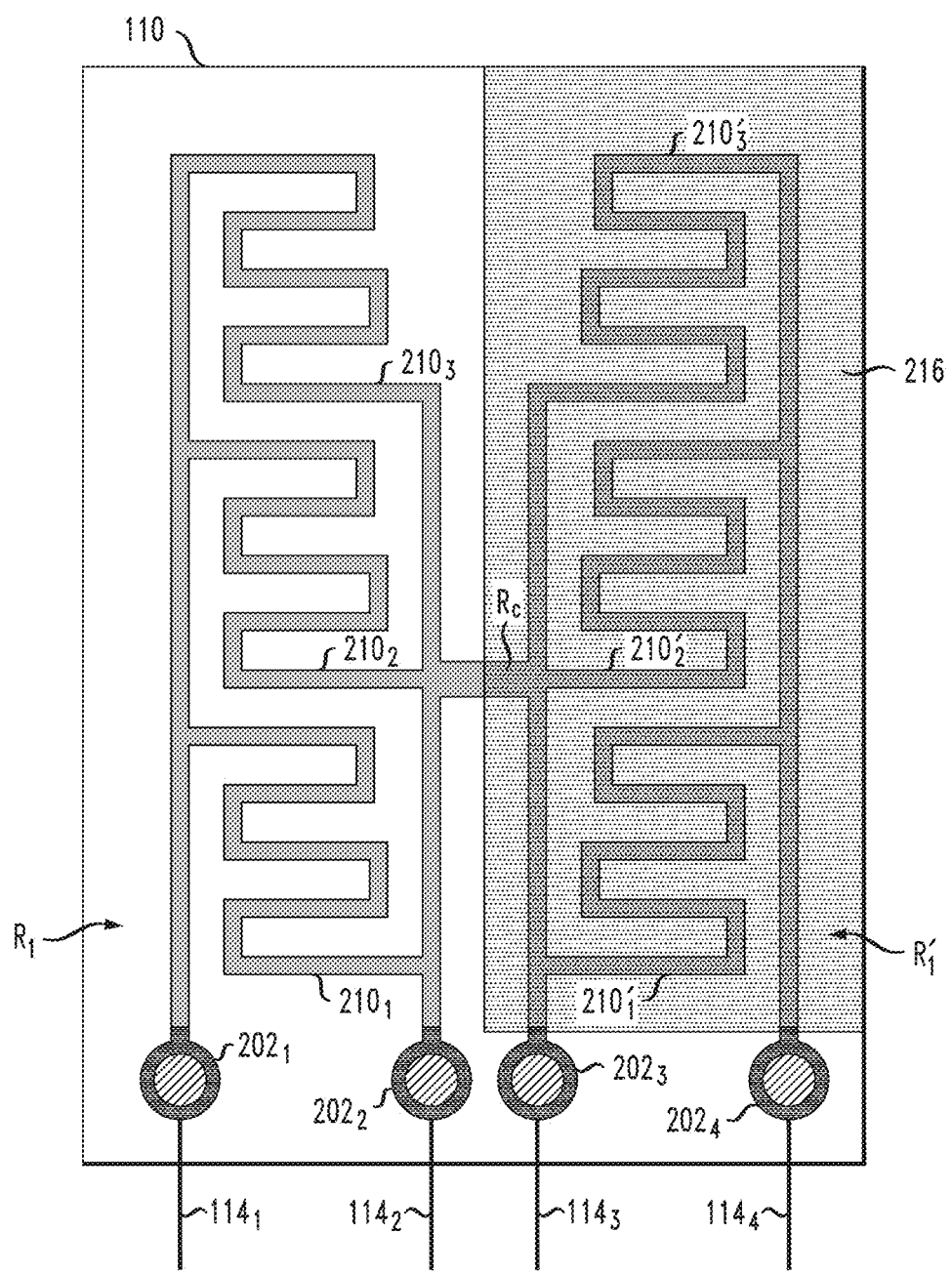
FIG. 5 shows a schematic view of yet another sensor that can be used in the electrical circuit of FIG. 1 according to an embodiment.

FIG. 5 shows a schematic view of an individual sensor 110 that can be used in circuit 100 (FIG. 1) according to yet another embodiment. In this embodiment, sensor 110 is also implemented as a four-terminal resistor, with the contact pads $202_1$-$202_4$ of the sensor serving as the four terminals of said resistor. Contact pads $202_1$-$202_4$ can be electrically connected to the sensor drive-and-readout circuit 140 using conductive tracks $114_1$-$114_4$, respectively, as indicated in FIG. 5.

The embodiment of sensor 110 shown in FIG. 5 is generally analogous to the embodiment of sensor 110 shown in FIG. 4, with the analogous elements of the two sensors being marked in FIGS. 4 and 5 using the same reference labels. The following description of the embodiment of FIG. 5 therefore focuses mainly on the differences between the two embodiments.

Resistor $R_1$ of FIG. 5 has only three electrically conductive traces 210, which are labeled $210_1$-$210_3$. However, the shape (e.g., the planar layout) of those conductive traces 210 is different from the shape used in the embodiment of FIG. 4. For example, a conductive trace 210 of FIG. 5 has a zigzag or serpentine shape and is about five times longer than a conductive trace 210 of FIG. 5.

Resistors $R_1'$ of FIGS. 4 and 5 differ from each other in the same way as resistors $R_1$.

In an alternative embodiment, a conductive trace 210 can have a different (from that of FIG. 5) number of zigzags.

FIG. 6 shows a semi-transparent perspective view of an equipment cabinet 500 according to an embodiment. Equipment cabinet 500 has rack-mounted equipment located inside the enclosure formed by a base plate 502, peripheral walls 504, and a cover plate 506. For clarity, cover plate 506 and some of the peripheral walls 504 are shown in FIG. 6 using a transparent representation, which enables the contents of equipment cabinet 500 to be visible in the shown view.

In an example embodiment, the equipment housed in equipment cabinet 500 comprises: (i) a main circuit board 510; (ii) a back plane 520; (iii) power-supply drawers $530_1$ and $530_2$; (iv) circuit packs $540_1$-$540_5$; and (v) a fan tray 550. The faceplates of main circuit board 510, power-supply drawers $530_1$ and $530_2$, circuit packs $540_1$-$540_5$, and fan tray 550 form a front panel 508 of equipment cabinet 500, which serves as one of the walls thereof.

Main circuit board 510 is an embodiment of electrical circuit 100 (FIG. 1) and, as such, comprises a plurality of IC packages 130, a plurality discrete circuit elements (such as capacitors, resistors, inductors, and/or active devices), a plurality of sensors 110 (see, e.g., FIGS. 2, 4, 5), a plurality of sensors 120 (FIG. 3), and sensor drive-and-readout circuit 140, all electrically connected to the corresponding PCB 102 (also see FIG. 1). In operation, main circuit board 510 may support communication between the various electronic components of the equipment housed in equipment cabinet 500 and provide connectors for connecting external circuits and/or devices. In an example embodiment, the IC packages 130 of main circuit board 510 may include significant sub-systems, such as one or more processors, one or more controllers, one or more interface circuits, one or more chipsets configured to support specific functions and/or applications, etc.

Back plane 520 comprises a plurality of electrical connectors configured to electrically interconnect the various equipment pieces housed in equipment cabinet 500 to enable their concerted operation as a functional system. For example, back plane 520 may operate to distribute power-supply voltages/currents generated by the power supplies located in drawers 530₁ and 530₂ to main circuit board 510 and circuit packs 540₁-540₅. Back plane 520 may further operate to enable communication between main circuit board 510 and circuit packs 540₁-540₅.

Power-supply drawers 530₁ and 530₂ contain power supplies configured to generate various power-supply voltages/currents that can be used to power the various equipment pieces housed in equipment cabinet 500.

Circuit packs 540₁-540₅ may include electrical and/or optical circuits that, in communication with main circuit board 510, enable the equipment housed in equipment cabinet 500 to perform its intended functions. Some or all of circuit packs 540₁-540₅ may also be connected to external circuits using the connectors located on their respective faceplates at front panel 508. At least some of circuit packs 540₁-540₅ may be implemented using respective PCBs. For example, circuit packs 540₁ includes a PCB that is labeled in FIG. 6 using the reference numeral 542. At least some of circuit packs 540₁-540₅ may be rack-mounted in equipment cabinet 500 in a movable manner, which enables easy extraction of such circuit packs through front panel 508, e.g., for inspection, repair, or replacement.

Fan tray 550 comprises cooling fans 552₁ and 552₂. In an example embodiment, a cooling fan 552 comprises an electric motor configured to drive an arrangement of blades and/or vanes, which typically includes a propeller rotated by the motor. Cooling fans 552₁ and 552₂ may or may not have air filters installed at the air-intake side thereof. Cooling fans 552₁ and 552₂ may or may not have stationary vanes installed at the air-intake side thereof.

When turned ON, the rotating blades (e.g., propellers) of cooling fans 552₁ and 552₂ generate an airflow (e.g., propel air) directed from the exterior of equipment cabinet 500, through the exhausts of the fans located on a long side 554 of fan tray 550, into the interior of the equipment cabinet. The air propelled by fans 552₁ and 552₂ flows through openings between the various equipment pieces inside equipment cabinet 500 and then exits the equipment cabinet through the air-exhaust vents that are typically located on an opposite side of the cabinet (e.g., on the corresponding wall 504 thereof). The air currents so generated can come into contact with any heated circuit components, thereby cooling them down.

In some environments, the air directed by cooling fans 552₁ and 552₂ into the interior of equipment cabinet 500 may also carry dust and salt particles and/or aerosols that can be deposited onto various surfaces inside equipment cabinet 500. Over time, the deposits accumulated in this manner on the surfaces inside equipment cabinet 500 can adversely affect the performance and/or reliability of at least some equipment pieces in various ways. The adverse effects may include but are not limited to: (i) mechanical effects, such as obstructions to the cooling airflow and/or to moving parts; (ii) optical effects, such as interference with the transmission of optical signals (if any); (iii) chemical effects, such as corrosion and metallic dendrite growth; and (iv) electrical effects, such as impedance change, circuit shorts, and open circuits.

Through simulation and experimentation, we have determined that equipment damage associated with the above-listed and possibly other adverse effects of environmental exposure may not be uniform throughout the interior of equipment cabinet 500, as well as within other similarly cooled enclosures. For example, dust deposition rates in different areas of the enclosure may differ by a factor of about 100. Indeed, a deposition per unit area of particulate matter capable of settling out of the airflow may be 10 or more times greater, or even 10 to 200 times greater, on some local area than an average deposition per unit area of such particulate matter on a major surface of the printed circuit board 102, e.g., for particulate matter with a size or diameter of about 2 microns or more. Therefore, targeted placement of damage sensors, such as sensors 110 and 120, can be important, e.g., for detecting equipment damage with high sensitivity and/or certainty.

As an example, FIG. 6 shows several sensors 110 and 120 located outside main circuit board 510. A first pair of such sensors 110 and 120 is located on back plane 520. Another pair of such sensors 110 and 120 is located on fan tray 550. Yet another pair of such sensors 110 and 120 is located on a peripheral wall 504. Yet another pair of such sensors 110 and 120 is located on the frame of the rack on which circuit packs 540₁-540₅ are mounted. A person of ordinary skill in the art will understand that, alternatively or in addition, sensors 110 and 120 may be placed at other exterior and interior locations of equipment cabinet 500.

Figure 7:
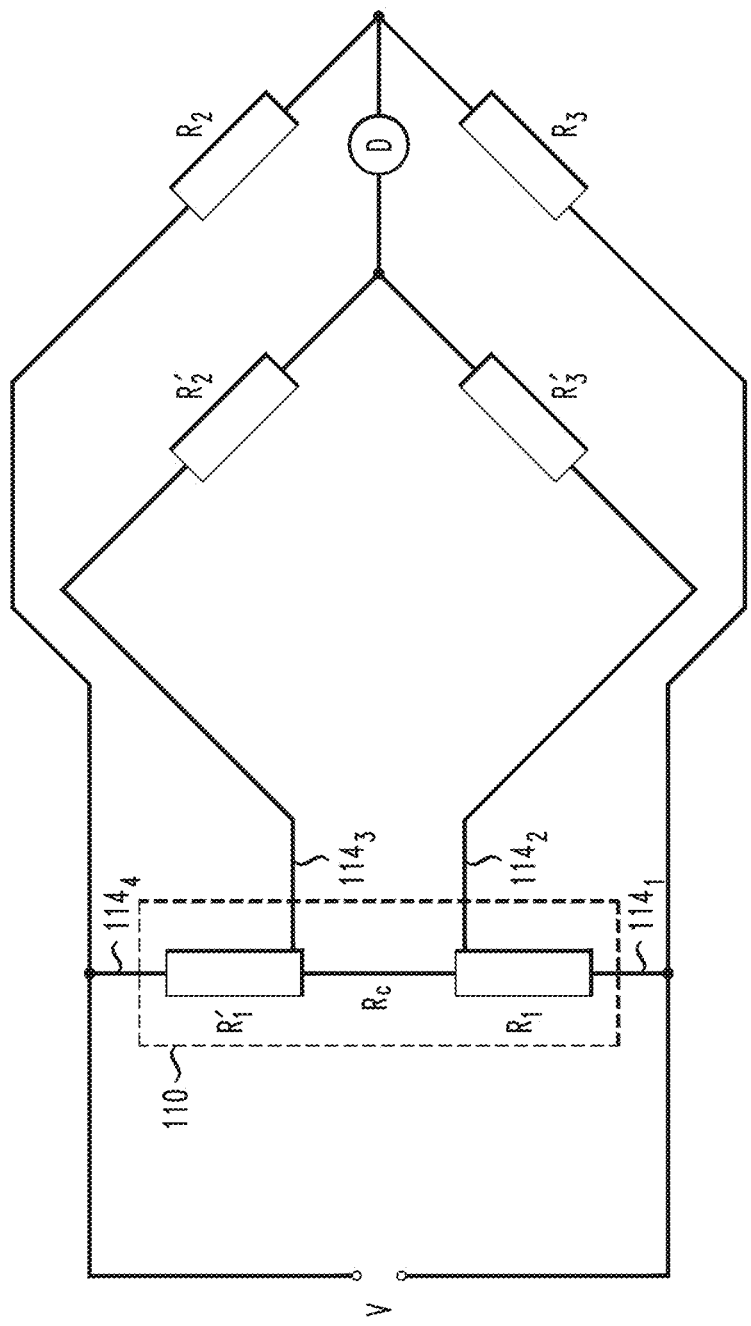
FIG. 7 shows a schematic diagram of an electrical circuit that can be used for resistance measurements in the electrical circuit of FIG. 1 according to an embodiment.

FIG. 7 shows a schematic diagram of an electrical circuit 700 that can be used for resistance measurements in circuit 100 (FIG. 1) according to an embodiment. Circuit 700 includes a sensor 110 of FIG. 4 or FIG. 5, which is connected to the other parts of circuit 700 using conductive tracks 114₁-114₄ (also see FIGS. 4 and 5). In an example embodiment, said other parts of circuit 700 can be implemented using a corresponding portion of circuit 140 (FIG. 1).

Circuit 700 implements a variant of the Kelvin bridge that enables an accurate resistance measurement of resistor $R_1$, e.g., by balancing the bridge such that no electrical current is flowing through the detector D when a suitable (e.g., dc) voltage V is applied to sensor 110 using conductive tracks 114₁ and 114₄. In an example embodiment, resistors $R_2$ and $R_2'$ can have an equal resistance $R_2$; and resistors $R_3$ and $R_3'$ can also have an equal resistance $R_3$. In this case, the bridge-balance equation can be expressed as follows:

$$R_x = R_3 \frac{R_r}{R_2} \quad (1)$$

where $R_x$ is the unknown (e.g., due to the effects of environmental exposure) resistance of resistor $R_1$; and $R_r$ is the reference resistance of resistor $R_1'$. Note that Eq. (1) does not include the resistance of resistor $R_c$, but enables the value of $R_x$ to be computed from the values of $R_2$, $R_3$, and $R_r$.

In an example embodiment, some or all of resistors $R_2$, $R_2'$, $R_3$, and $R_3'$ are controllably adjustable in a manner that enables the bridge to be balanced (i.e., the current through detector D to be nulled). The corresponding resistor values can then be used to compute the value of $R_x$, e.g., using Eq. (1) or other applicable bridge-balance equation.

A person of ordinary skill in the art will understand that other suitable bridge circuits can alternatively be used to measure the value of $R_x$. For example, in some embodiments, sensor 110 can be connected for resistance measurements using a Wheatstone bridge circuit.

FIG. 8 shows a flowchart of a method 800 of estimating the condition of an electrical circuit and/or a structural element located in relatively close proximity to one or more sensors 110 and 120 in equipment cabinet 500 (FIG. 6) according to an embodiment. In some embodiments, the electrical circuit whose condition is being estimated using method 800 can comprise one or more of IC packages $130_1$-$130_N$. In some other embodiments, the electrical circuit whose condition is being estimated using method 800 can comprise one or more electronic circuits and/or devices housed in equipment cabinet 500 (FIG. 6). The structural elements whose condition is being estimated using method 800 may include walls, plates, beams, chassis, racks, etc., of equipment cabinet 500 (FIG. 6).

At step 802 of method 800, it is determined whether or not to start resistance measurements of one or more sensors 110 and 120. In one example embodiment, an external electronic controller can initiate the resistance measurements by applying, e.g., by way of conductive tracks 144, an appropriate control signal to circuit 140. In another example embodiment, circuit 140 can run an internal timer and initiate the resistance measurements when the timer runs out. In yet another example embodiment, circuit 140 can initiate the resistance measurements in accordance with a predetermined schedule, e.g., stored in a non-volatile memory of the circuit. In some embodiments, circuit 140 can be configured to initiate resistance measurements of sensors 110 and 120 in response to any of a plurality of triggers, e.g., based on an externally generated control signal, an internal timer, and/or a predetermined schedule.

If resistance measurements of sensors 110 and 120 are initiated at step 802, then the processing of method 800 is directed to step 804. Otherwise, circuit 140 remains in a waiting mode by cycling through step 802.

At step 804, circuit 140 measures the respective resistances of some or all of sensors 110 and 120, e.g., any desired subset of those sensors.

In one example embodiment, a resistance measurement carried out at step 804 may include the sub-steps of (i) applying a fixed voltage to a selected sensor and (ii) sensing and measuring the electrical current flowing through that sensor under the applied voltage. In another example embodiment, a resistance measurement carried out at step 804 may include the sub-steps of (i) driving a fixed current through a selected sensor and (ii) sensing and measuring the resulting voltage generated across that sensor. The resistance values of individual sensors can then be obtained by computing a ratio of the voltage to the current.

In yet another example embodiment, a resistance measurement carried out at step 804 may include balancing a corresponding bridge circuit (e.g., 700, FIG. 7) by controllably tuning one or more resistors therein. The resistance values corresponding to individual sensors 110 can then be obtained using the corresponding bridge-balance equation(s), such as Eq. (1).

The resistance values obtained at step 804 are typically time-stamped and stored in a nonvolatile memory of circuit 140, e.g., for retrieval at a later time and/or for further processing at step 806.

At step 806, circuit 140 processes the resistance values obtained at step 804 to estimate the condition of one or more electrical circuits and/or structural elements located in relatively close proximity to the sensors 110 and 120 whose resistances were measured at step 804. In some embodiments, the data processing of step 806 may also use the resistance values stored in the nonvolatile memory of circuit 140 at one or more previous occurrences of step 804 corresponding to other (e.g., earlier) measurement times. In various embodiments, the data processing carried out at step 806 may include one or more data-processing operations selected from an example set of data-processing operations described in more detail below.

A first example data-processing operation that can be used at step 806 comprises comparing a measured resistance value with a threshold resistance value.

In an example embodiment, each of sensors 110 and 120 can be assigned a respective set of threshold resistance values. Such set of threshold resistance values may include, e.g., three different threshold resistance values, each indicative of a respective different degree of damage to the corresponding electrical circuit or structural element caused by the environmental exposure at the deployment site. The measured resistance value of the sensor can then be compared with each of these threshold resistance values to approximately gauge the condition of the circuit or structural element.

For example, sensor $110_i$ can be assigned three threshold resistance values $\rho_{i1}<\rho_{i2}<\rho_{i3}$, where the threshold resistance value $\rho_{i1}$ is greater than the initial resistance $r_{i0}$ corresponding to sensor $110_i$. As used herein, the term "initial resistance" refers to the resistance of the pertinent resistor at the factory, prior to the field deployment of circuit 100. The threshold resistance values $\rho_{i1}$, $\rho_{i2}$, and $\rho_{i3}$ can be selected, e.g., as follows:

(i) the measured resistance $r_i$ of sensor $110_i$ smaller than $\rho_{i1}$ indicates that the corresponding electrical circuit or structural element is likely to be in a satisfactory working condition;

(ii) the measured resistance $r_i$ of sensor $110_i$ being in the interval between $\rho_{i1}$ and $\rho_{i2}$ indicates that the corresponding electrical circuit or structural element has likely sustained some minor damage;

(iii) the measured resistance $r_i$ of sensor $110_i$ being in the interval between $\rho_{i2}$ and $\rho_{i3}$ indicates that the corresponding electrical circuit or structural element has likely sustained moderate damage and may need to be replaced or repaired relatively soon; and (iv) the measured resistance $r_i$ of sensor $110_i$ greater than $\rho_{i3}$ indicates that the corresponding electrical circuit or structural element has likely sustained serious damage, might fail at any time, and needs to be replaced or repaired in an expeditious manner.

As another example, sensor $120_j$ can be assigned three threshold resistance values $\sigma_{j1}>\sigma_{j2}>\sigma_{j3}$, where the threshold resistance value $\sigma_{j1}$ is smaller than the initial surface insulation resistance $R_{j0}$ of sensor $120_j$, and $j=1, 2, \ldots, M$. The threshold resistance values $\sigma_{j1}$, $\sigma_{j2}$, and $\sigma_{j3}$ can be selected, e.g., as follows:

(i) the measured surface insulation resistance $R_j$ of sensor $120_j$ greater than $\sigma_{j1}$ indicates that the corresponding electrical circuit is likely to be in a satisfactory working condition;

(ii) the measured surface insulation resistance $R_j$ of sensor $120_j$ being in the interval between $\sigma_{j1}$ and $\sigma_{j2}$ indicates that the corresponding electrical circuit has likely sustained some minor damage;

(iii) the measured surface insulation resistance $R_j$ of sensor $120_j$ being in the interval between $\sigma_{j2}$ and $\sigma_{j3}$ indicates that the corresponding electrical circuit has likely sustained moderate damage and may need to be replaced or repaired relatively soon; and (iv) the measured surface insulation resistance $R_j$ of sensor $120_j$ greater than $\sigma_{j3}$ indicates that the corresponding electrical circuit has likely sustained serious damage, might fail at any time, and needs to be replaced or repaired in an expeditious manner.

Another example data-processing operation that can be used at step 806 comprises computing a rate of resistance change and comparing the computed rate with a threshold rate.

For example, for sensor $110_i$, the rate $v_i$ of resistance change can be computed in accordance with Eq. (2):

$$v_i = \{r_i(t_2) - r_i(t_1)\}/(t_2 - t_1) \quad (2)$$

where $r_i(t_2)$ is the resistance of sensor $110_i$ measured at time $t_2$; $r_i(t_1)$ is the resistance of sensor $110_i$ measured at time $t_1$; and $t_2 > t_1$. The rate $v_i$ computed in this manner can then be compared with a corresponding threshold rate $\lambda_i$. Similarly, for sensor $120_j$, the rate $V_j$ of surface insulation resistance change can be computed in accordance with Eq. (3):

$$V_j = \{R_j(t_1) - R_j(t_2)\}/(t_2 - t_1) \quad (3)$$

where $R_j(t_1)$ is the surface insulation resistance of sensor $120_j$ measured at time $t_1$; $R_j(t_2)$ is the surface insulation resistance of sensor $120_j$ measured at time $t_2$; and $t_2 > t_1$. The rate $V_j$ computed in this manner can then be compared with a corresponding threshold rate $\mu_j$. The threshold rates $\lambda_i$ and $\mu_j$ can be selected such that any rate $v_i$ greater than $\lambda_i$ and/or any rate $V_j$ greater than $\mu_j$ are indicative of an unacceptably harsh environment that might warrant relocation of the corresponding equipment from the current site or another appropriate remedial action by the equipment operator.

Yet another example data-processing operation that can be used at step 806 comprises kinetic analysis of a set of values of the rate $v_i$ obtained at different times t. For example, any step-like changes in the rate $v_i$ may be indicative of the presence of above-described hidden defects in one or more traces 210 of sensor $110_i$. More specifically, a higher rate $v_i$ may be observed when a trace 210 having a defect is being corroded, but is not broken yet. Once said trace 210 is broken by corrosion, a lower rate $v_i$ may be observed, e.g., because the defect-catalyzed corrosion no longer contributes to the resistance change from that point on, thereby causing the rate $v_i$ to be smaller than before. A person of ordinary skill in the art will understand how to perform this type of kinetic analysis for any particular sensor size and a known or estimated probability of defect occurrence in traces 210. Such kinetic analysis can be performed, inter alia, to determine the number of defective traces 210 in each particular sensor $110_i$.

Yet another example data-processing operation that can be used at step 806 comprises computing an overall "health" indicator H for the corresponding equipment. In one possible embodiment, the health indicator H can be computed in accordance with Eq. (4):

$$H = \sum_{i=1}^{L} \frac{A_i}{r_i} + \sum_{j=1}^{M} B_j R_j \quad (4)$$

where $A_i$ is a fixed weighting coefficient corresponding to sensor $110_i$, and $B_j$ is a fixed weighting coefficient corresponding to sensor $120_j$. A person of ordinary skill in the art will understand that the value of the health indicator H computed in this manner tends to decrease as the environmental-exposure time for circuit 100 increases. Therefore, a health indicator value smaller than a certain designated threshold value $H_0$ (i.e., $H < H_0$) can be used to prompt the equipment operator to conduct or schedule an inspection of the corresponding equipment for possible maintenance and/or repairs to address the deteriorated "health" thereof.

At step 808, circuit 140 uses the signal/data processing results of steps 804 and 806 to determine whether or not an appropriate alarm signal needs to be generated to alert the equipment operator about the deteriorating condition of the corresponding equipment. In various embodiments, various types of alarm signals can be generated depending on the types of data processing carried out at step 806. For example, one or more of the following fixed conditions can be used to cause a corresponding alarm message to be generated and transmitted out at step 810:

(i) the resistance $r_i$ of sensor $110_i$ measured at step 804 falls into the interval between $\rho_{i1}$ and $\rho_{i2}$;
(ii) the resistance $r_i$ of sensor $110_i$ measured at step 804 falls into the interval between $\rho_{i2}$ and $\rho_{i3}$;
(iii) the resistance $r_i$ of sensor $110_i$ measured at step 804 is greater than $\rho_{i3}$;
(iv) the surface insulation resistance $R_j$ of sensor $120_j$ measured at step 804 falls into the interval between $\sigma_{j1}$ and $94_{j2}$;
(v) the surface insulation resistance $R_j$ of sensor $120_j$ measured at step 804 falls into the interval between $\sigma_{j2}$ and $\sigma_{j3}$;
(vi) the surface insulation resistance $R_j$ of sensor $120_j$ measured at step 804 is smaller than $\sigma_{j3}$;
(vii) the rate $v_i$ of resistance change for sensor $110_i$ computed at step 806 is greater than $\lambda_i$;
(viii) the rate $V_j$ of resistance change for sensor $120_j$ computed at step 806 is greater than $\mu_j$; and
(ix) the health indicator H computed at step 806 is smaller than $H_0$.

If it is determined at step 808 that any of the relevant conditions from this condition set is satisfied, then the processing of method 800 is directed to step 810. Otherwise, the processing of method 800 is directed back to step 802.

In some embodiments, the above-indicated conditions may be appropriately modified to avoid false alarms, which may otherwise be generated due to the possible presence of hidden defects in some traces 210 of some sensors 110.

For example, some or all of the thresholds $\rho_{i1}$, $\rho_{i2}$, etc. may be adjusted such that the alarm is not automatically generated in response to a defective trace 210 being broken by corrosion.

If it is determined, e.g., by the kinetic analysis, that there are two defective traces 210 in sensor $110_i$, then the thresholds $\rho_{i1}$, $\rho_{i2}$, etc. may be adjusted such that the alarm is not automatically generated in response to two defective traces 210 being broken by corrosion.

If it is determined, e.g., by the kinetic analysis, that there are three defective traces 210 in sensor $110_i$, then the thresholds $\rho_{i1}$, $\rho_{i2}$, etc. may be adjusted such that the alarm is not automatically generated in response to three defective traces 210 being broken by corrosion, etc.

At step 810, circuit 140 generates an appropriate alarm message that indicates the condition(s) that caused the alarm message to be generated. Circuit 140 then transmits the generated alarm message, e.g., by way of conductive tracks 144, to the corresponding external electronic controller. After the transmission, the processing of method 800 is returned back to step 802. The external electronic controller may respond to the received alarm message by issuing a corresponding alert for the equipment operator.

According to an example embodiment disclosed above, e.g., in the summary section and/or in reference to any one or any combination of some or all of FIGS. 1-8, provided is an apparatus comprising: a control circuit (e.g., 140, FIG. 1); and an integrated planar resistive sensor (e.g., 110, FIGS. 4, 5) having a first parallel array of electrically conductive traces (e.g., 210, FIGS. 4, 5) electrically connected across electrical terminals (e.g., $202_1$-$202_4$, FIGS. 4, 5) of the control circuit, the first parallel array being constructed to expose at least some of the electrically conductive traces thereof to an environmental atmosphere; and wherein the control circuit is configured to generate an alarm (e.g., 810, FIG. 8) in response to measuring (e.g., 804, FIG. 8) a resistance of the integrated planar resistive sensor that is higher than a threshold, the threshold being such that the alarm is not automatically generated in response to one of the electrically conductive traces being broken.

In some embodiments of the above apparatus, the first parallel array has at least three electrically conductive traces (e.g., as in FIG. 4 or 5).

In some embodiments of any of the above apparatus, the first parallel array has at least three electrically conductive traces (e.g., as in FIG. 4 or 5).

In some embodiments of any of the above apparatus, the first parallel array has at least ten electrically conductive traces (e.g., as in FIG. 4).

In some embodiments of any of the above apparatus, the threshold is such that the alarm is not automatically generated in response to two of the electrically conductive traces being broken.

In some embodiments of any of the above apparatus, the threshold being such that the alarm is not automatically generated in response to three of the electrically conductive traces being broken.

In some embodiments of any of the above apparatus, the apparatus further comprises a second parallel array of electrically conductive traces (e.g., 210', FIGS. 4, 5) electrically connected across electrical terminals of the control circuit, at least some of the electrically conductive traces of the second parallel array being isolated from the environmental atmosphere by one or more protective layers (e.g., 216, FIGS. 4, 5).

In some embodiments of any of the above apparatus, the control circuit is configured to compare electrical resistances of the first and second parallel arrays.

In some embodiments of any of the above apparatus, the first and second parallel arrays have a same number of electrically conductive traces.

In some embodiments of any of the above apparatus, the control circuit is configured to measure electrical resistance of the first parallel array using a bridge circuit (e.g., 700, FIG. 7), the bridge circuit having the second parallel array connected therein as a reference resistor.

In some embodiments of any of the above apparatus, the electrically conductive traces of the first parallel array are connected in parallel to one another between first and second ones of the electrical terminals; and wherein the electrically conductive traces of the second parallel array are connected in parallel to one another between third and fourth ones of the electrical terminals.

In some embodiments of any of the above apparatus, the integrated planar resistive sensor includes an electrically conductive trace (e.g., $R_c$, FIGS. 4, 5) connected between the first and second parallel arrays.

In some embodiments of any of the above apparatus, the electrical resistance between the first and second ones of the four electrical terminals is in a range between 0.1Ω and 10Ω; and wherein the electrical resistance between the third and fourth ones of the four electrical terminals is in the range between 0.1Ω and 10Ω.

In some embodiments of any of the above apparatus, the integrated planar resistive sensor is attached to a structural element of an enclosure for electrical equipment (e.g., 500, FIG. 6), the enclosure hosting therein the control circuit.

In some embodiments of any of the above apparatus, the first parallel array of electrically conductive traces in an undamaged state and the second parallel array of electrically conductive traces have a same electrical resistance. In some embodiments of any of the above apparatus, the control circuit is configured to set an alarm threshold based on a set of resistance values measured at different times.

According to another example embodiment disclosed above, e.g., in the summary section and/or in reference to any one or any combination of some or all of FIGS. 1-8, provided is an apparatus comprising: a plurality of resistive sensors (e.g., 110, FIGS. 1 and 6) electrically connected to a control circuit (e.g., 140, FIG. 1), the resistive sensors being constructed such that electrical resistances thereof are responsive to damage caused by an environmental exposure of the resistive sensors, the control circuit being configured to measure the electrical resistances; wherein the plurality of resistive sensors includes a first resistive sensor (e.g., 110, FIGS. 4, 5) having a plurality of electrically conductive traces (e.g., 210, FIGS. 4, 5) disposed on a substrate and electrically connected to four electrical terminals (e.g., $202_1$-$202_4$, FIGS. 4, 5), each of the electrical terminals being externally electrically connected (e.g., using the respective one of $114_1$-$114_4$, FIGS. 4, 5) to the control circuit, some of the electrically conductive traces being protected (e.g., by 216, FIGS. 4, 5) from the environmental exposure to form a reference resistor (e.g., $R_1'$, FIGS. 4, 5) within the first resistive sensor, some other of the electrically conductive traces being susceptible to the environmental exposure to form a sense resistor (e.g., $R_1$, FIGS. 4, 5) within the first resistive sensor; and wherein the control circuit is configured to measure an electrical resistance of the sense resistor by probing the sense and reference resistors through the four electrical terminals.

In some embodiments of the above apparatus, the sense resistor comprises a first set (e.g., $210_1$-$210_{15}$, FIG. 4) of the electrically conductive traces connected in parallel to one another between first and second ones of the four electrical terminals.

In some embodiments of any of the above apparatus, the reference resistor comprises a second set (e.g., $210_1'$-$210_{15}'$, FIG. 4) of the electrically conductive traces connected in parallel to one another between third and fourth ones of the four electrical terminals.

In some embodiments of any of the above apparatus, the plurality of electrically conductive traces includes an electrically conductive trace (e.g., $R_c$, FIGS. 4, 5) connected between said first and second sets.

In some embodiments of any of the above apparatus, the electrical resistance between the first and second ones of the four electrical terminals is in a range between 0.1Ω and 10Ω; and wherein the electrical resistance between the third and fourth ones of the four electrical terminals is in the range between 0.1Ω and 10Ω.

In some embodiments of any of the above apparatus, at least some of the electrically conductive traces of the first set have a serpentine shape (e.g., $210_1$-$210_3$, FIG. 5).

In some embodiments of any of the above apparatus, the first set has at least three of the electrically conductive traces (e.g., as in FIG. 4 or 5).

In some embodiments of any of the above apparatus, the first set has at least ten of the electrically conductive traces (e.g., as in FIG. 4).

In some embodiments of any of the above apparatus, the control circuit is configured to measure the electrical resistance of the sense resistor using a bridge circuit (e.g., 700, FIG. 7), the bridge circuit including the reference resistor.

In some embodiments of any of the above apparatus, the first resistive sensor is attached to a structural element of an enclosure for electrical equipment (e.g., 500, FIG. 6), the enclosure hosting therein the control circuit.

In some embodiments of any of the above apparatus, at least some of the plurality of resistive sensors and the control circuit are supported on a common substrate (e.g., 102, FIG. 1).

In some embodiments of any of the above apparatus, the control circuit is configured to predict (e.g., at 806/808, FIG. 8) whether a different circuit or a structural element is likely to break down or be broken based on the measured electrical resistances.

In some embodiments of any of the above apparatus, the control circuit is further configured to transmit an alarm message (e.g., at 810, FIG. 8) to an external electronic controller based on the prediction.

In some embodiments of any of the above apparatus, the electrical resistance of the sense resistor increases in response to the damage.

In some embodiments of any of the above apparatus, the sense resistor is susceptible to internal damage in response to a type of the environmental exposure.

In some embodiments of any of the above apparatus, the type of the environmental exposure includes exposure to atmospheric dust.

In some embodiments of any of the above apparatus, the type of the environmental exposure includes exposure to a corrosive agent.

In some embodiments of any of the above apparatus, the type of the environmental exposure includes exposure to humidity.

In some embodiments of any of the above apparatus, the type of the environmental exposure includes exposure to a temperature below a first fixed temperature or above a higher second fixed temperature.

In some embodiments of any of the above apparatus, the sense resistor in an undamaged state and the reference resistor have the same electrical resistance.

While this disclosure includes references to illustrative embodiments, this specification is not intended to be construed in a limiting sense.

Although some embodiments are described above in reference to "cooling fans," alternative embodiments are possible in which the fans are configured and operated to more-generally manage the temperature of the corresponding electrical equipment, with such temperature measurement including heating and/or cooling as necessary for proper operability of the electrical equipment.

Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three-dimensional structure as shown in the figures. Such "height" would be vertical where the electrodes are horizontal but would be horizontal where the electrodes are vertical, and so on. Similarly, while all figures show the different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure. For example, a relatively thin layer of adhesive or other suitable binder can be used to implement such "direct attachment" of the two corresponding components in such physical structure.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

As used in this application, the term "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

As used herein and in the claims, the term "provide" with respect to a system, device, or component encompasses designing or fabricating the system, device, or component; causing the system, device, or component to be designed or fabricated; and/or obtaining the system, device, or component by purchase, lease, rental, or other contractual arrangement.

What is claimed is:

1. An apparatus comprising:
   a control circuit; and
   an integrated planar resistive sensor having a first parallel array of electrically conductive traces electrically connected across electrical terminals of the control circuit, the first parallel array being constructed to expose at least some of the electrically conductive traces thereof to an environmental atmosphere; and
   wherein the control circuit is configured to generate an alarm in response to measuring a resistance of the integrated planar resistive sensor that is higher than a threshold, the threshold being such that the alarm is not automatically generated in response to only one of the electrically conductive traces being broken.

2. The apparatus of claim 1, wherein at least some of the electrically conductive traces have a serpentine shape.

3. The apparatus of claim 1, wherein the first parallel array has at least three electrically conductive traces.

4. The apparatus of claim 1, wherein the first parallel array has at least ten electrically conductive traces.

5. The apparatus of claim 1, wherein the threshold is such that the alarm is not automatically generated in response to two of the electrically conductive traces being broken.

6. The apparatus of claim 1, wherein the threshold being such that the alarm is not automatically generated in response to three of the electrically conductive traces being broken.

7. The apparatus of claim 1, further comprising a second parallel array of electrically conductive traces electrically connected across electrical terminals of the control circuit, at least some of the electrically conductive traces of the second parallel array being isolated from the environmental atmosphere by one or more protective layers.

8. The apparatus of claim 7, wherein the control circuit is configured to compare electrical resistances of the first and second parallel arrays.

9. The apparatus of claim 7, wherein the first and second parallel arrays have a same number of electrically conductive traces.

10. The apparatus of claim 7, wherein the control circuit is configured to measure electrical resistance of the first parallel array using a bridge circuit, the bridge circuit having the second parallel array connected therein as a reference resistor.

11. The apparatus of claim 7,
    wherein the electrically conductive traces of the first parallel array are connected in parallel to one another between first and second ones of the electrical terminals; and
    wherein the electrically conductive traces of the second parallel array are connected in parallel to one another between third and fourth ones of the electrical terminals.

12. The apparatus of claim 11, wherein the integrated planar resistive sensor includes an electrically conductive trace connected between the first and second parallel arrays.

13. The apparatus of claim 11,
    wherein the electrical resistance between the first and second ones of the four electrical terminals is in a range between $0.1\Omega$ and $10\Omega$; and
    wherein the electrical resistance between the third and fourth ones of the four electrical terminals is in the range between $0.1\Omega$ and $10\Omega$.

14. The apparatus of claim 1, wherein the integrated planar resistive sensor is attached to a structural element of an enclosure for electrical equipment, the enclosure hosting therein the control circuit.

15. The apparatus of claim 1, wherein the first parallel array of electrically conductive traces in an undamaged state and the second parallel array of electrically conductive traces have a same electrical resistance.

16. The apparatus of claim 1, wherein the control circuit is configured to set an alarm threshold based on a set of resistance values measured at different times.

* * * * *